United States Patent [19]

Roberge et al.

[11] Patent Number: 5,189,376
[45] Date of Patent: Feb. 23, 1993

[54] METHOD FOR THE MEASURMENT OF CAPACITANCE, WITH APPLICATION TO LINEAR MEASUREMENT OF DISTANCE

[75] Inventors: James K. Roberge, Lexington; Martha L. Gray, Cambridge, both of Mass.

[73] Assignee: Massachusetts Institute of Technology, Cambridge, Mass.

[21] Appl. No.: 629,725

[22] Filed: Dec. 17, 1990

[51] Int. Cl.⁵ .............................................. G01R 27/26
[52] U.S. Cl. ................................. 324/662; 324/661; 324/678
[58] Field of Search ............... 324/661, 662, 678, 684, 324/688

[56] References Cited

U.S. PATENT DOCUMENTS

| | | | |
|---|---|---|---|
| 3,706,919 | 12/1972 | Abbe | 317/246 |
| 3,836,847 | 9/1974 | Lucas | 324/62 |
| 3,990,005 | 11/1976 | Abbe et al. | 324/61 R |
| 4,160,204 | 7/1979 | Holmgren et al. | 324/207 |
| 4,187,459 | 2/1980 | Wolfendale | 324/678 X |
| 4,187,460 | 2/1980 | Dauge et al. | 324/678 |
| 4,217,542 | 8/1980 | Abbe et al. | 324/662 |
| 4,217,543 | 8/1980 | Strong | 324/678 X |
| 4,243,933 | 1/1981 | Rollman | 324/60 CD |
| 4,353,029 | 10/1982 | Abbe et al. | 324/236 |
| 4,675,596 | 6/1987 | Smith | 324/683 |
| 4,743,836 | 5/1988 | Grzybowski et al. | 324/678 |
| 4,924,172 | 5/1990 | Holmgren | 324/664 |

Primary Examiner—Jack B. Harvey
Attorney, Agent, or Firm—Fish & Richardson

[57] ABSTRACT

A technique for measuring capacitance and displacement, in which two circuits are combined, one that produces a current proportional to capacitance, and another that integrates that current between two reference levels, and supplies an output proportional to the integration time. In preferred embodiments, the first circuit is a capacitive pump circuit, and the second circuit a dual-slope integrator.

16 Claims, 3 Drawing Sheets

METHOD FOR THE MEASUREMENT OF CAPACITANCE, WITH APPLICATION TO LINEAR MEASUREMENT OF DISTANCE

BACKGROUND OF THE INVENTION

This invention relates to methods for making accurate measurements of capacitance and displacement.

Despite the improvements that have been made in measuring small distances, there remains a need for a simple, yet highly-accurate technique for producing a digital representation of such distances. It is known to make distance measurements by relying on changes in the capacitance between two plates, but known techniques tend to first linearize for the inverse relationship between distance and capacitance, and then digitize the linearized signal. For example, a circuit known as a capacitive pump is used to generate a current proportional to capacitance. The current is linearized, and then converted to digital form.

In other measurement applications, analog to digital conversion has been performed using what is known as dual-slope integration. For example, dual-slope integration has been used in measuring resistance.

SUMMARY OF THE INVENTION

We have discovered a much more accurate, yet simple and practical, technique for measuring capacitance and displacement. Two circuits are combined, one that produces a current proportional to capacitance, and another that integrates that current between two reference levels, and supplies an output proportional to the integration time. In preferred embodiments, the first circuit is a capacitive pump circuit, and the second circuit a dual-slope integrator.

The invention provides direct digitization of capacitance and distance measurements, and with greater accuracy. It avoids errors that can result when linearization and digitization are performed separately.

Other features and advantages of the invention will be apparent from the following description of the preferred embodiments, and from the claims.

DESCRIPTION OF THE PREFERRED EMBODIMENTS

To understand the preferred embodiments, it is helpful to discuss the known techniques of dual-slope integration and current generation using capacitive pump circuits.

Figure 1:
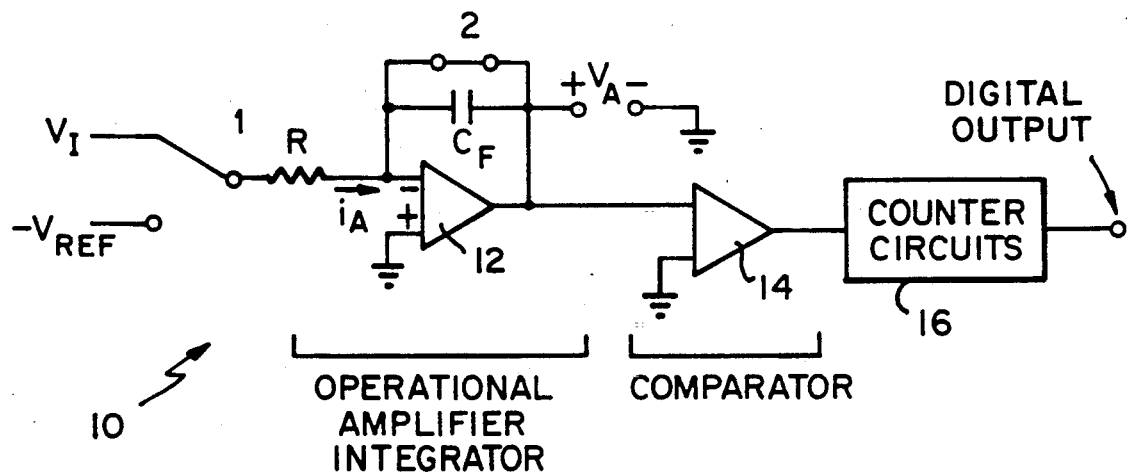
FIG. 1 is a schematic of a prior art dual-slope integrator circuit.
Figure 2:
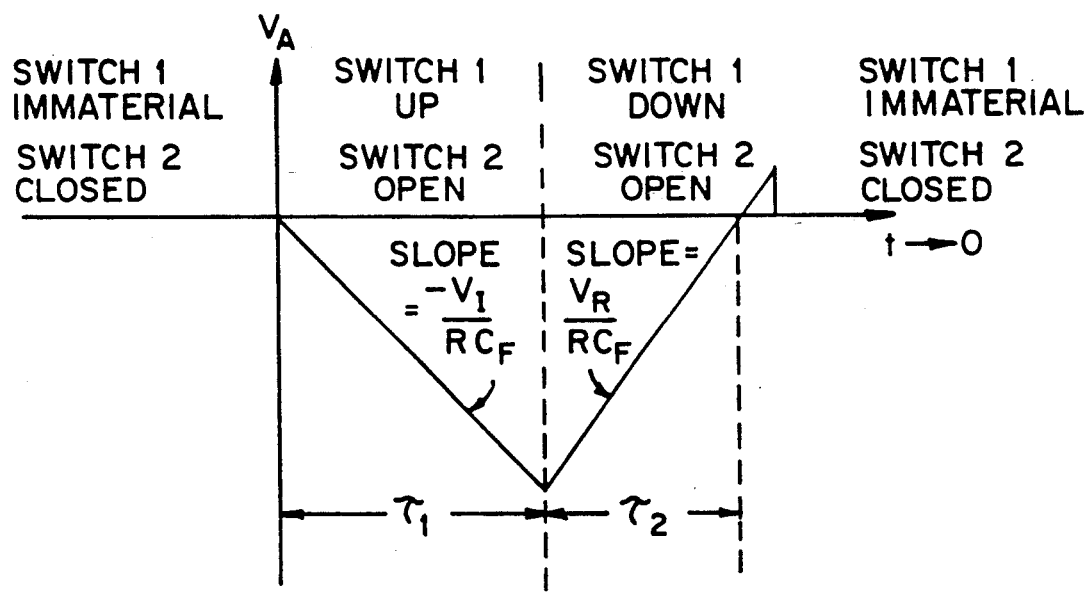
FIG. 2 is diagram illustrating a dual-slope integrator output waveform.

FIG. 1 shows a dual-slope integrator circuit 10. Dual-slope integration is an analog-to-digital conversion technique that provides extreme accuracy. FIG. 2 shows the waveform of the output of integrator 12 in FIG. 1. (It is assumed in the figure that both $V_I$ and $V_{REF}$ are constant.)

The dual-slope integrator is sometimes used to measure the ratio of two voltages, $V_I$ and $V_{Ref}$ in this case. Prior to the start of the conversion cycle, switch 2 is closed, and the integrator out $V_A$ is zero. At time $t=0$, switch 2 is opened, and switch 1 is connected to $V_I$. In this state, current $i_A$ is $$i_A = V_I/R.$$

The slope of the integrator output voltage is negative as shown in FIG. 2. Its value is $$dV_A/dt = -V_I/RC_R = -i_A/C_F.$$

This switch state is maintained for a predetermined period $\tau_1$.

At time $t=\tau_1$, switch 1 changes position, and the voltage $-V_{Ref}$ is connected to the integrator input. Current $i_A$ then becomes $$i_A = -V_{Ref}/R.$$

The slope of the integrator output voltage during $\tau_2$ is $$dV_A/dt = V_{Ref}/RC_F = -i_A/C_F.$$

The time $\tau_2$ required for the voltage $V_A$ to return to zero is determined with the aid of comparator 14. Comparator 14 sends control signals to counter circuits 16 which determine the digital representation of $\tau_2$. Switch 2 is closed some time after interval $\tau_2$, so that integrator 12 can be initialized for its next conversion cycle.

The geometry of the waveform in FIG. 2 shows that $$V_I\tau_1/RC_F = V_{Ref}\tau_2/RC_F.$$

If we let $$V_I/R = i_1, \text{ and } V_{Ref}/R = i_2,$$

then $$i_1/i_2 = \tau_2/\tau_1$$

and $$V_I/V_{Ref} = \tau_2/\tau_1.$$

Now, if $V_{Ref}$ and $\tau_1$ are assumed to be fixed and known, the voltage $V_I$ can be determined directly from the measurement of $\tau_2$.

Figure 3:
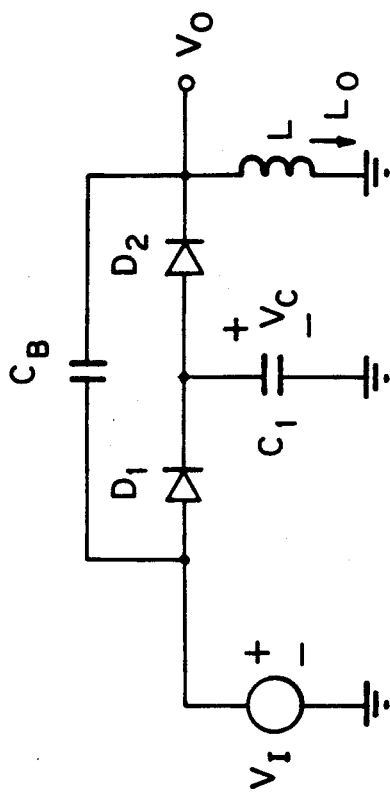
FIG. 3 is a schematic of a prior art capacitive pump circuit.

This dual-slope technique can be applied to measuring the ratio of capacitances. FIG. 3 shows a prior art capacitive pump circuit where $C_1$ is the capacitance to be measured. The voltage source $V_I$ of FIG. 3 is a periodic signal with zero average value. The circuit is generally implemented with $C_B >> C_1$ and $C_B L >> 1/(2\pi f_I)^2$ where $f_I$ is the frequency of the signal $V_I$. The peak-to-peak value of $V_C$, the voltage on the capacitor, is $V_{CP}$. The current $i_o$ is nearly constant and has an average value of $$i_{avg} = C_1 V_{CP} f_I.$$

Figure 4:
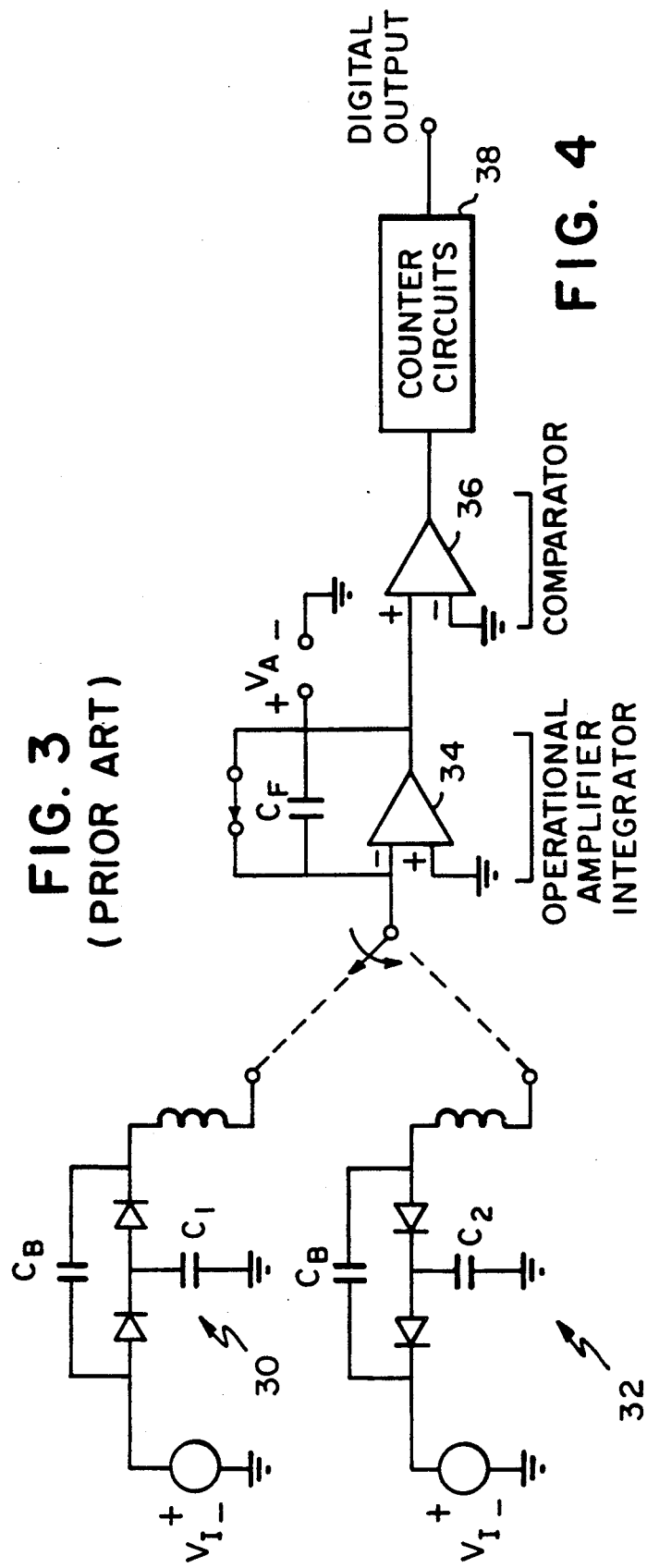
FIG. 4 is a schematic of a preferred embodiment of the invention for measuring capacitance.

The capacitance measurement preferred embodiment is shown in FIG. 4. A capacitive pump circuit 30, with a capacitor value of $C_1$, is used to generate the current $i_1$ to integrator 34. Another capacitive pump circuit 32, with capacitor of value $C_2$ and the diode directions reversed to reverse the polarity of its output current, is used to generate the current $i_2$ to integrator 34. The relationship of the ratio of currents versus the ratio of integration times for the dual-slope integrator can be expressed as $$C_1 V_{CP} f_1 / C_2 V_{CP} f_1 = \tau_2 / \tau_1$$

or $$C_1 / C_2 = \tau_2 / \tau_1.$$

The ratiometric feature associated with dual-slope integration makes the measurement of the ratio of two capacitances independent of both the frequency and the amplitude of the drive signal used. Since a digital representation of the ratio of $\tau_2$ to $\tau_1$ can be determined by the dual-slope integrator, a digital output proportional to the ratio of the two capacitance can also be easily determined.

The capacitor of value $C_2$ of FIG. 4 can been replaced by a parallel-plate structure $C_M$ separated by air or free space. The area of the top plate is A, and the separation between the two plates is d. To the extent that fringing and the effects of stray capacitance are eliminated, the capacitance of $C_M$ is $$C_M = \epsilon_o A / d$$

where $\epsilon_o$ is the permittivity of free space. The $i_{avg}$ is then $$i_{avg} = -f_1 V_{CP} \epsilon_o A / d$$

The ratiometric method introduced earlier can be used to provide a digital output that is linearly proportional to d. By substituting $\epsilon_o A / d$ for $C_2$, the following ratiometric relationship can be obtained $$C_1 d / \epsilon_o A = \tau_2 / \tau_1$$

or $$d = \tau_2 \epsilon_o A / \tau_1 C_1.$$

Many variations of this approach to distance measurement can be used to simplify the circuitry and reduce errors. For example, it is not necessary to integrate the current provided by the capacitive-pump circuit during the first portion of the integration cycle. An alternative would be to initialize the output of the integrator to some level $-V_o$, and then integrate the current supplied by a capacitive pump circuit with a measurement capacitor $C_M$. If $V_{CP}$ is the peak-to-peak capacitor voltage of the capacitive pump circuit, then $\tau_2$ can be expressed as $$\tau_2 = V_o d C_F / f_1 V_{CP} \epsilon_o A$$

or $$d = \tau_2 f_1 V_{CP} \epsilon_o A / V_o C_F.$$

The advantage in this modification is that it eliminates one of the capacitive pump circuits, and thus minimizes the effects of its stray capacitance, and simplifies the overall system. Another possibility is to integrate a current derived from a voltage $V_B$ through a resistor $R_B$ during the period $\tau_1$. Distance d is then related to $\tau_2$ via $$d = \tau_2 R_B f_1 V_{CP} \epsilon_o A / \tau_1 V_B.$$

Figure 5:
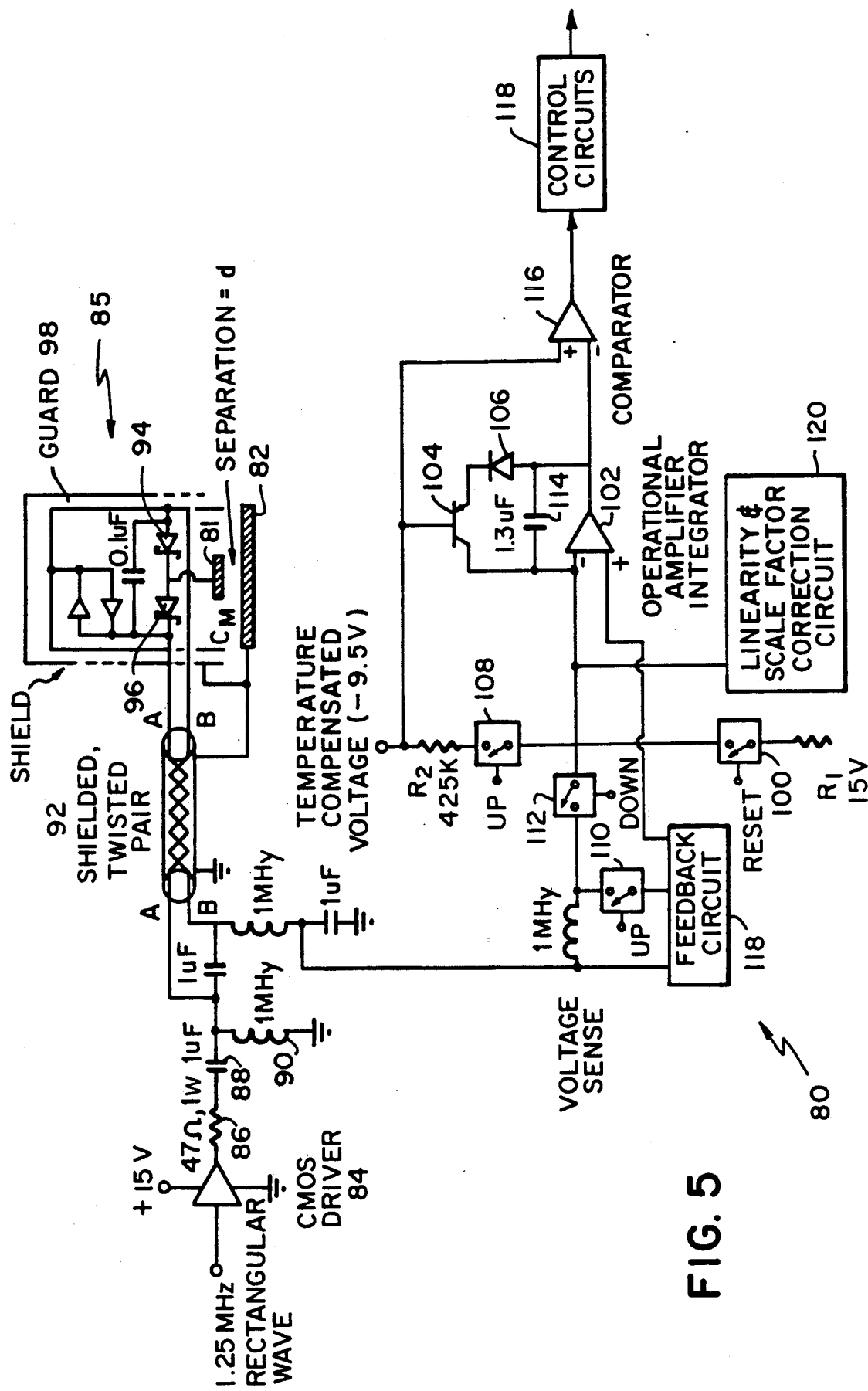
FIG. 5 is a schematic of a preferred embodiment of the invention for measuring distance.

This particular arrangement is discussed in detail in the following embodiment and is shown in FIG. 5.

FIG. 5 shows a system 80 that performs linear digitization of distance, where a non-contact, capacitive transducer is employed. The system uses a relatively long up integration period (the first portion of the integration cycle) and a large diameter probe 82 to achieve high accuracy measurements centered about a working distance of 1 mm. CMOS driver 84 with a 1.25 MHz rectangular wave input drives probe assembly 85. The output of driver 84 has a peak-to-peak voltage of about 15 volts and a nominal 50% duty cycle. Resistor 86, capacitor 88, and inductor 90 provide a nominally zero d-c level probe drive signal. Resistor 86 also provides protection in the event that top plate 81 of the probe is shorted to ground.

The probe assembly includes a guard 98 to minimize the effects of stray capacitance and reduce fringing of the electric field between capacitor plates. The probe has a top plate (0.5" in diameter) that forms with ground plate 82 a capacitor. The top plate is driven via a length of shielded twisted pair 92 by a peak-to-peak voltage of approximately 14.4 volts. This peak-to-peak voltage is equal to the voltage from the driver reduced by the forward drops of two 1N5711 diodes 94 and 96. The 0.5" diameter probe has a nominal capacitance of 1.12 pf at a separation of 1 mm between capacitor plates. The average value of the current supplied by the probe is 1.25 MHz × 1.12 pf × 14.4 volts = 20 μA.

An analog-to-digital conversion cycle is started by closing "reset" switch 100. With the "reset" switch closed, a −1 mA current is applied to the node that includes the inverting input terminal of operational amplifier 102. The state of the switches driven by "UP" and "DOWN" signals is unimportant, since other signal currents are small in magnitude compared to 1 mA. The −1 mA current drives the output of integrator 102 positive until transistor 104 conducts 1 mA with the integrator output at approximately 10.7 volts. A voltage of 10.7 initializes integrator 102 so that the output of comparator 116 is low. Diode 106 is included in the transistor emitter circuit to prevent base-to-emitter breakdown.

The positive reset level, instead of ground, is chosen to permit a larger amplitude signal at the integrator output, a feature that reduces the effects of noise. The voltage level of 9.5 volts is used as a reference for comparator 116 and as bias for reset transistor 104.

Following the reset interval, reset switch 100 is opened. "UP" switches 108 and 110 are closed, and "DOWN" switch 112 is opened. A current of 22.5 μA is applied to the node that includes the inverting input terminal of operational amplifier 102. With this current and a 1.3 μf integrator capacitor 114, the slope of the integrator output voltage is about −17.3 volts/second. When the integrator output voltage crosses the comparator reference level and comparator 116 changes state, the control circuitry starts to count a clock to establish the up integration interval $\tau_1$. A value $\tau_1 = 1$ second is used in the described embodiment, so that the integrator output level is about −8 volts at the end of $\tau_1$.

During the up integration interval, feedback circuit 118 (shown in block form) senses the d-c potentials at the output of the probe circuitry and generates a signal that drives this voltage to zero. This level initializes voltages across capacitors in the probe circuitry to proper levels, and also makes the d-c level across the diodes connected to measuring capacitor 82 nominally zero to reduce their leakage current.

At the end of the up integration interval or $\tau_1$, "UP" switches 108 and 110 are opened, and "DOWN" switch 112 is closed. In this state, the current supplied from the probe circuitry is integrated to drive the integrator output voltage in a positive direction. Feedback circuit 118 again keeps the d-c level at the output of the probe circuitry near zero to minimize currents from diode leakage.

Correction circuit 120 generates a current of the power series form $$I_0 + I_1 t + I_2 t^2 + \ldots$$

to be applied to the input of integrator 102 during $\tau_2$. The correction current is used to adjust scale factor and reduce the effects of various offsets and nonlinearities. Errors that can be moderated by appropriate choice of coefficients include those resulting from stray capacitance and fringing associated with the probe, dielectric absorption of the integrating capacitor, and integrator bias current. It should be noted that the actual source of the errors does not matter; any smooth error pattern can be reduced via the technique. It should be noted that the optimum values for $I_0, I_1, I_2, \ldots$ are dependent on the specifics of implementation.

The output of comparator 116 goes to control circuits 118 that measure the time interval $\tau_2$. The interval $\tau_1$ starts when the integrator output crosses the comparator reference, and the interval $\tau_2$ is determined by noting when the integrator output returns to this threshold. Operation in this mode makes system 80 insensitive to comparator offsets and independent of the integrator output level following reset, as long as the level is more positive than the comparator reference level. As discussed earlier, $\tau_2$ is ideally linearly proportional to the distance between the plates of measuring capacitor 82. Therefore, once $\tau_2$ is determined, the linear distance between capacitor plates can be derived.

System 80 described above can be easily expanded to multiplex signals from a number of probes in applications where there are multiple distances to be measured. One of the ways the multiplexing can be accomplished is by connecting the output diodes from multiple probes together and enabling one probe by gating only its driver, or by using analog switches at the outputs of the various probes. In this case different linearizing functions may be required for different probes.

Other embodiments are within the following claims.

What is claimed is:

1. Apparatus for measuring capacitance, comprising:
   a first circuit that produces a current, the average amplitude of which is proportional to the capacitance to be measured, said first circuit comprising a capacitive pump circuit,
   a second circuit that integrates the output current of the first circuit between first and second reference levels, and that supplies a representation of the time required for the integration,
   said second circuit including a correction circuit for correcting nonlinearities, said correction circuit providing a power series correction.

2. The apparatus of claim 1 wherein said second circuit supplies a digital representation of the time required for integration.

3. The apparatus of claim 1 wherein said apparatus is suited for measuring the ratio of two capacitances,
   wherein said apparatus comprises two of said first circuits, one for each of the two capacitances to be measured, and
   wherein said second circuit integrates the current output of one of said first circuits over a known time interval to provide said first reference level, and integrates the current output of the second of said first circuits until reaching said second reference level.

4. The apparatus of claim 1 or 3 further comprising a comparator to sense crossing of said second reference level.

5. The apparatus of claim 3 wherein said probe has a guard to reduce stray capacitance and fringing of the electric field.

6. Apparatus for measuring displacement, comprising:
   a probe in which the distance to be measured is the separation between two electrodes forming a capacitor,
   a first circuit that produces a current, the average amplitude of which is proportional to the capacitance to be measured, said first circuit comprising a capacitive pump circuit,
   a second circuit that integrates the output current of the first circuit between first and second reference levels, and that supplies a digital representation of the time required for the integration,
   said second circuit including a correction circuit for correcting nonlinearities, said correction circuit providing a power series correction.

7. The apparatus of claim 6 wherein said electrodes are two parallel plates.

8. The apparatus of claim 1 or 6 wherein said second circuit includes circuitry that prescribes one of said reference levels by integrating a known current over a known time interval.

9. The apparatus of claim 1 or 6 wherein said first circuit includes circuitry for repetitively applying a known voltage to a capacitor, then measuring the amount of charge that is stored as a result of the applied voltage.

10. The apparatus of claim 1 or 6 wherein said second circuit is a slope integrator circuit.

11. The apparatus of claim 10 wherein the slope integrator circuit is a dual slope integrator circuit.

12. The apparatus of claim 11 further comprising a circuit responsive to the output of said comparator and that counts clock pulses to provide said digital representation.

13. A method of measuring capacitance, comprising the steps of:
   producing a current, the average amplitude of which is proportional to the capacitance to be measured, using a capacitive pump circuit,
   integrating the output current of the first circuit between first and second reference levels, and supplying a representation of the time required for the integration, and
   correcting for nonlinearities using a power series correction.

14. The method of claim 13 wherein what is supplied is a digital representation of the time required for integration.

15. The method of claim 13 applied to measuring the ratio of two capacitances.

16. A method of measuring displacement, comprising the steps of:

providing a probe in which the distance to be measured is the separation between two electrodes forming a capacitor, producing a current, the average amplitude of which is proportional to the capacitance to be measured, using a capacitive pump circuit, integrating the current between first and second reference levels, and supplying a digital representation of the time required for the integration, and correcting for nonlinearities using a power series correction.

* * * * *